United States Patent
Zhou et al.

(10) Patent No.: US 7,753,107 B2
(45) Date of Patent: Jul. 13, 2010

(54) HEAT DISSIPATION DEVICE

(75) Inventors: Da-Yuan Zhou, Shenzhen (CN); Guang Yu, Shenzhen (CN); Chun-Chi Chen, Tu-Cheng (TW); Shih-Hsun Wung, Tu-Cheng (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 999 days.

(21) Appl. No.: 11/309,534

(22) Filed: Aug. 18, 2006

(65) Prior Publication Data

US 2008/0041561 A1 Feb. 21, 2008

(51) Int. Cl.
*F28F 7/00* (2006.01)

(52) U.S. Cl. ............... 165/80.3; 165/121; 165/122; 165/86; 361/695; 257/722; 415/178

(58) Field of Classification Search ............... 165/80.3, 165/121, 122; 361/697, 695, 679.48; 257/722; 415/178
See application file for complete search history.

(56) References Cited

U.S. PATENT DOCUMENTS

| | | | |
|---|---|---|---|
| 5,871,396 A * | 2/1999 | Shen | 454/184 |
| 6,304,445 B1 | 10/2001 | Bollesen | |
| 6,711,015 B2 * | 3/2004 | Syring et al. | 361/695 |
| 6,736,196 B2 * | 5/2004 | Lai et al. | 165/122 |
| 6,788,536 B2 | 9/2004 | Lai et al. | |
| 7,009,841 B2 * | 3/2006 | Chen et al. | 361/695 |
| 7,021,368 B2 * | 4/2006 | Lin et al. | 165/104.33 |
| 7,040,384 B2 | 5/2006 | Shiang-Chich | |
| RE39,784 E * | 8/2007 | Hsueh | 361/697 |
| 7,408,774 B1 * | 8/2008 | Anderl et al. | 361/695 |
| 7,505,266 B2 * | 3/2009 | Sanchez et al. | 361/695 |
| 7,542,272 B2 * | 6/2009 | Pike et al. | 361/679.48 |
| 7,580,259 B2 * | 8/2009 | Hsiao | 361/695 |
| 2007/0047200 A1 * | 3/2007 | Huang | 361/695 |
| 2007/0256813 A1 * | 11/2007 | Ho | 165/80.3 |

FOREIGN PATENT DOCUMENTS

| | | | | |
|---|---|---|---|---|
| CN | 2807325 Y | | 8/2006 | |
| TW | M280096 | | 11/2005 | |
| TW | 200741425 | * | 11/2007 | 165/80.3 |

* cited by examiner

*Primary Examiner*—Terrell L McKinnon
(74) *Attorney, Agent, or Firm*—Jeffrey T. Knapp

(57) ABSTRACT

A heat dissipation device for a heat-generating electronic component includes a heat sink (10) and a fan (20) mounted on a lateral side of the heat sink. The heat sink defines a plurality of channels (162) therein. A fan holder (30) is rotatably mounted on the heat sink. The fan is fixedly mounted on the fan holder and faces towards the channels of the heat sink. An airflow generated by the fan flows through the channels of the fan. When the fan holder rotates with respect to the heat sink, an airflow direction of the fan is changed accordingly.

20 Claims, 7 Drawing Sheets

HEAT DISSIPATION DEVICE

FIELD OF THE INVENTION

The present invention relates generally to a heat dissipation device, and more particularly to a heat dissipation device having a heat sink and a fan movably mounted on the heat sink, wherein the fan can move with respect to the heat sink to vary an airflow direction thereof.

DESCRIPTION OF RELATED ART

Electronic devices such as central processing units (CPUs) generate large amounts of heat during normal operation, which can destabilize the electronic devices and cause damage to the electronic devices.

Typically, a heat sink is mounted on the CPU to remove heat therefrom. A fan is often mounted on the heat sink via a fan holder to provide forced airflow to the heat sink. One example is disclosed in U.S. Pat. No. 6,788,536 B2. The fan generates a current of air flowing through channels of the heat sink, to promote heat dissipation efficiency of the heat sink. However, once the fan is mounted on the heat sink, a flowing direction of the forced airflow generated by the fan cannot be changed freely according to different requirements. Generally, when it is necessary to change the airflow direction the heat sink and the fan must be reassembled or redesigned, which is unduly time-consuming and raises production costs.

Thus, it is desired to devise a new heat dissipation device which can vary an airflow direction of the fan to meet different requirements.

SUMMARY OF THE INVENTION

The present invention relates to a heat dissipation device for a heat-generating electronic component. The heat dissipation device includes a heat sink and a fan mounted on a lateral side of the heat sink. The heat sink defines a plurality of channels therein. A fan holder is rotatably mounted on the heat sink. The fan is fixedly mounted on the fan holder and faces the channels of the heat sink. An airflow generated by the fan flows through the channels of the fan. When the fan holder rotates with respect to the heat sink, an airflow direction of the fan is changed accordingly.

Other advantages and novel features of the present invention will become more apparent from the following detailed description of preferred embodiment when taken in conjunction with the accompanying drawings, in which:

BRIEF DESCRIPTION OF THE DRAWINGS

Many aspects of the present device can be better understood with reference to the following drawings. The components in the drawings are not necessarily drawn to scale, the emphasis instead being placed upon clearly illustrating the principles of the present device. Moreover, in the drawings, like reference numerals designate corresponding parts throughout the several views.

DETAILED DESCRIPTION OF THE INVENTION

Figure 1:
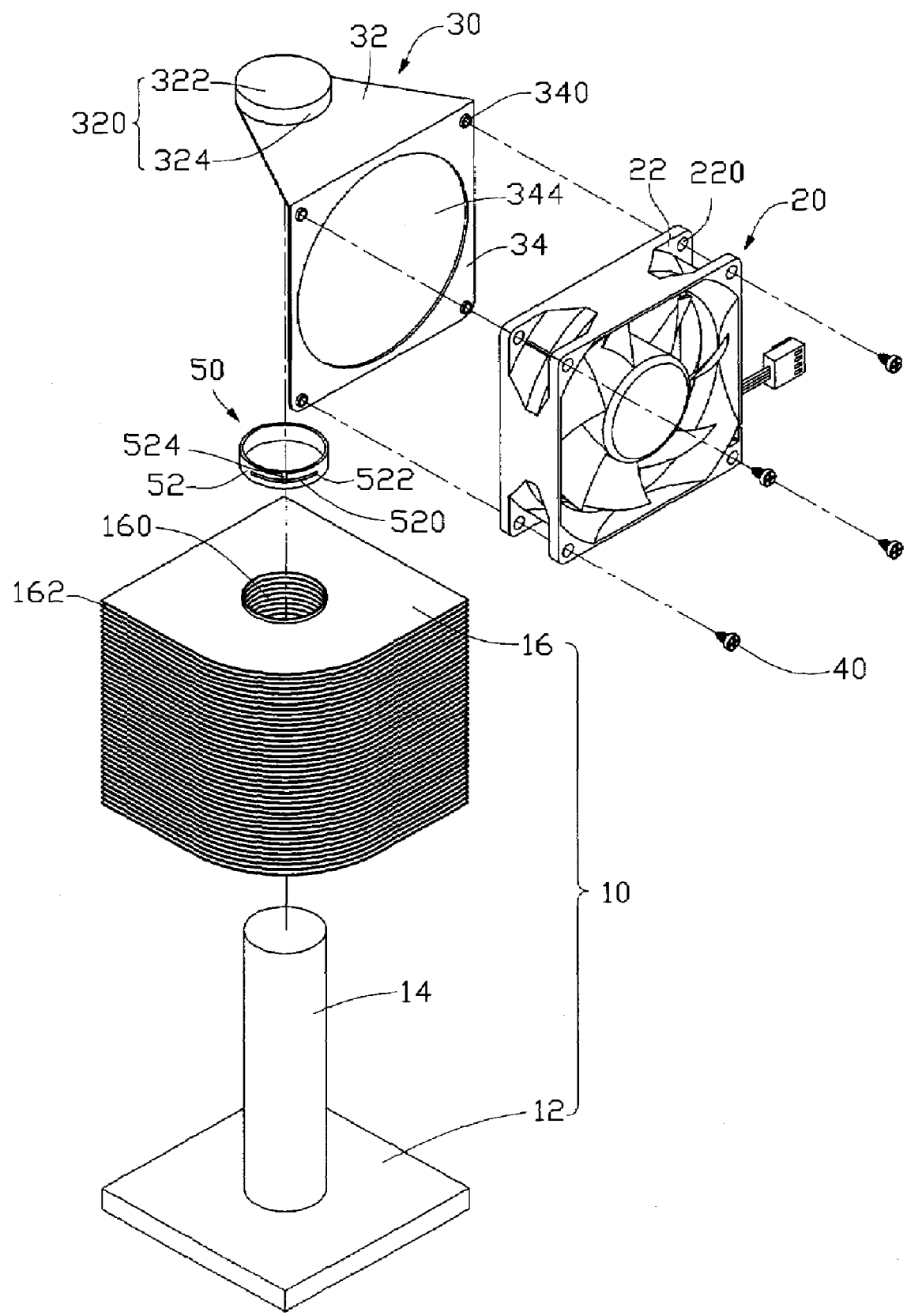
FIG. 1 is an exploded, isometric view of a heat dissipation device in accordance with a preferred embodiment of the present invention.
Figure 2:
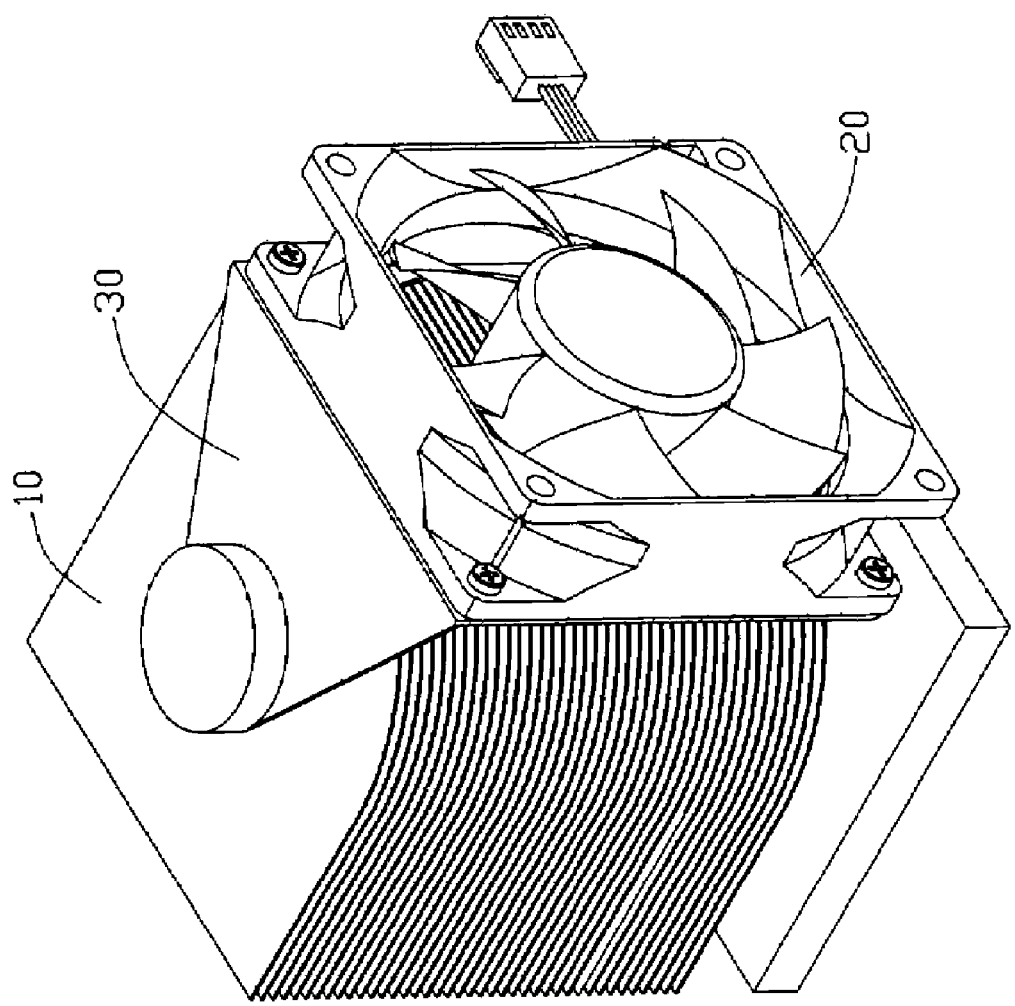
FIG. 2 is an assembled view of the heat dissipation device of FIG. 1.
Figure 3:
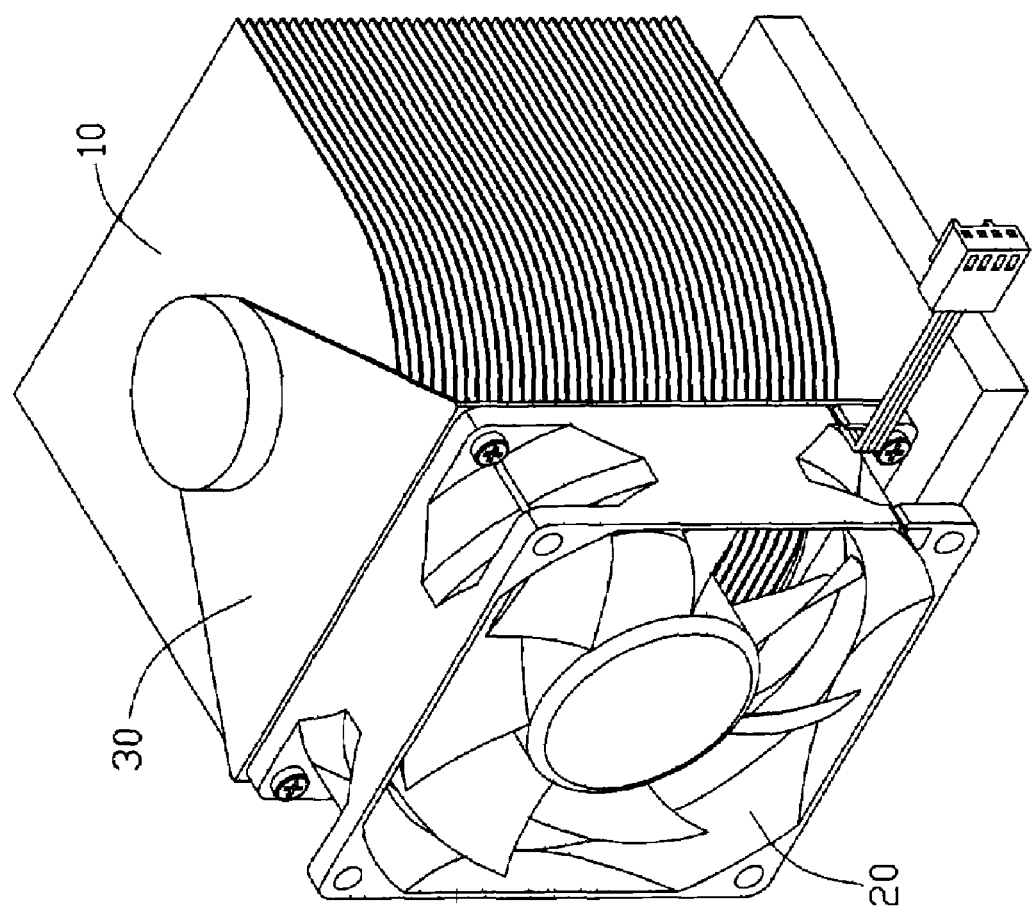
FIG. 3 is a view similar to FIG. 2, wherein a fan moves to another position different from that of FIG. 2.

Referring to FIGS. 1-3, a heat dissipation device in accordance with a preferred embodiment of the present invention is used for being mounted to a heat-generating electronic element, such an IC package (not shown), to dissipate heat therefrom. The heat dissipation device comprises a heat sink 10, and a fan 20 movably mounted to a lateral side of the heat sink 10 via a fan holder 30, wherein the fan holder 30 is pivotably connected to the heat sink 10.

The heat sink 10 comprises a square base 12, a heat conducting member 14 extending from a top of the base 12 and a plurality of fins 16 mounted on the base 12. The heat conducting member 14 has a cylindrical shape, being made of highly thermally conductive materials such as copper. The fins 16 are parallel to the base 12 and define a through hole 160 therein for providing passage of the heat conducting member 14. Each of the fins 16 has a substantially quadrant-shaped configuration so that the fins 16 form an arched curved surface. The heat conducting member 14 is fixedly received in the through hole 160 of the fins 16 by soldering means or by other conventional means such that heat received by the base 12 is immediately transferred to the whole fins 16 via the heat conducting member 14. The fan 20 is mounted on the heat sink 10 via the fan holder 30 and faces towards the channels 162 between the fins 16 in such a manner that an airflow generated by the fan 20 can enter the channels 162 of the fins 16. The fan 20 is capable of moving around the heat conducting member 14 of the heat sink 16 via the fan holder 30. The fan 20 has a square configuration, and comprises four corners 22 adjacent to the fins 16. Each corner 22 of the fan 20 defines an aperture 220 therein.

The fan holder 30 in accordance with a first preferred embodiment of the present invention is formed by stamping and bending a single piece of metal. The fan holder 30 comprises a mounting plate 32 and a faceplate 34 extending downwardly from and perpendicular to the mounting plate 32. The mounting plate 32 has a substantially triangular configuration. A cap 320 protrudes upwardly from a rear end of the mounting plate 32 for pivotably mounting on a top portion of the heat conducting member 14 and rotating relative to the heat conducting member 14. Also referring to FIG. 4, the cap 320 comprises a round top portion 322 and a cylindrical wall 324 extending from an edge of the top portion 322 in such a manner that a chamber 326 is defined by the top portion 322 and the wall 324. An inner surface of the wall 324 forms a protruding point 328. The faceplate 34 has a square configuration similar to that of the fan 20, for mounting the fan 20 thereon. The faceplate 34 forms four mounting poles 340 at four corners 342 thereof. Each of the mounting poles 340 defines a threaded hole (not labeled) therein positioned corresponding to the aperture 220 of the fan 20. The faceplate 34 defines a central opening 344 therein. The fan 20 is mounted on the faceplate 34 using screws 40 extending through the apertures 220 of the fan 20 to screw into the threaded holes of the mounting poles 340 of the faceplate 34. The fan 20 is positioned on the faceplate 34 of the fan holder 30 and blows the airflow through the opening 344 toward the channels 162 of the heat sink 10.

Figure 4:
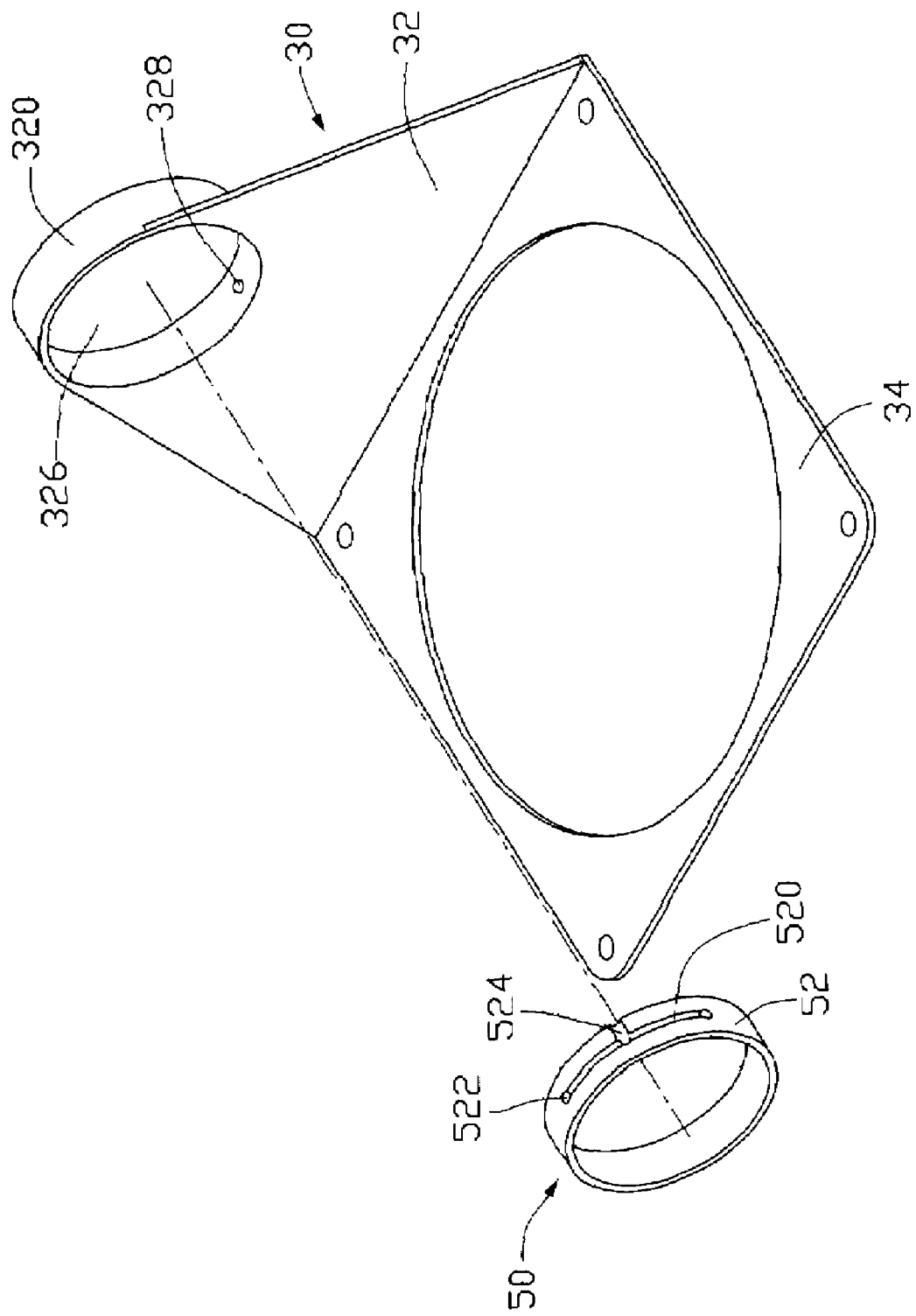
FIG. 4 is an exploded, enlarged view of a fan holder and a connecting element of the heat dissipation device of FIG. 1.

Referring to FIG. 1 and FIG. 4, a connecting element 50 surrounds the top portion of the heat conducting member 14 and is connected therewith by metallurgical means or by other conventional means in such a manner that the connecting element 50 is fixedly mounted on the heat conducting member 14. In this embodiment, the connecting element 50 is an annular ring. The cap 320 of the fan holder 30 rotatably engages with the connecting element 50. The connecting element 50 has a cylindrical wall 52 having a diameter smaller than that of the wall 324 of the cap 320 thus allowing the inner surface of the wall 324 of the cap 320 to engage with an outer surface of the wall 52 of the connecting element 50. The wall 52 of the connecting element 50 defines an elongated slot 520 extending along a circumferential direction thereof, allowing the protruding point 328 to slide therein. A length of the slot 520 can vary according to different requirements. Two spaced round recesses 522 having diameters similar to that of the protruding point 328 are defined in opposite ends of the slot 520. The protruding point 328 is used for sliding in the slot 520 and being engaged in the recesses 522 of the connecting element 50. Alternatively, the recesses 522 may have a number more than two and be freely defined along the length of the slot 520. Each of the recesses 522 has a radial depth larger than that of the slot 520 so that the protruding point 328 is engaged in the recesses 522. A guiding slot 524 is defined in the outer surface of the wall 52 of the connecting element 50 along an axial direction of the connecting element 50. The guiding slot 524 communicates with the slot 520 for guiding the protruding point 328 to smoothly enter the slot 520.

Referring to FIG. 2 and FIG. 3, when the cap 320 of the fan holder 30 engages with the connecting element 50, the protruding point 328 slides in the slot 520 of the connecting element 50 via the guiding slot 524. At this position, once a circumferential force is exerted on the fan holder 30, the protruding point 328 slides along a lengthwise direction of the slot 520, which means that the fan holder 30 rotates with respect to the heat sink 10; the rotation continues until the protruding point 328 is forcedly slid into a corresponding recess 522. Accordingly, the fan 20 is located at a specific orientation. To change the orientation of the fan 20, the user only needs to exert a force on the fan 20 larger enough to release the engagement between the protruding point 328 and the corresponding recess 522 and then rotates the fan 40 to reach a position where the protruding point 328 engages in the other recess 522.

Alternatively, the slot 520 and the recesses 522 may be directly defined in the top portion of the heat conducting member 14 without the connecting element 50 thereon. The cap 320 of the fan holder 30 directly engages with the top portion of the heat conducting member 14 and rotates with respect to the heat conducting member 14 of the heat sink 10 to change the airflow direction of the fan 20.

The heat dissipation device of the present invention is adapted to meet different demands according to different computer systems. The direction of the airflow generated by the fan 20 can be freely changed via a rotation of the fan holder 30 without any tools or disassembly.

Figure 5:
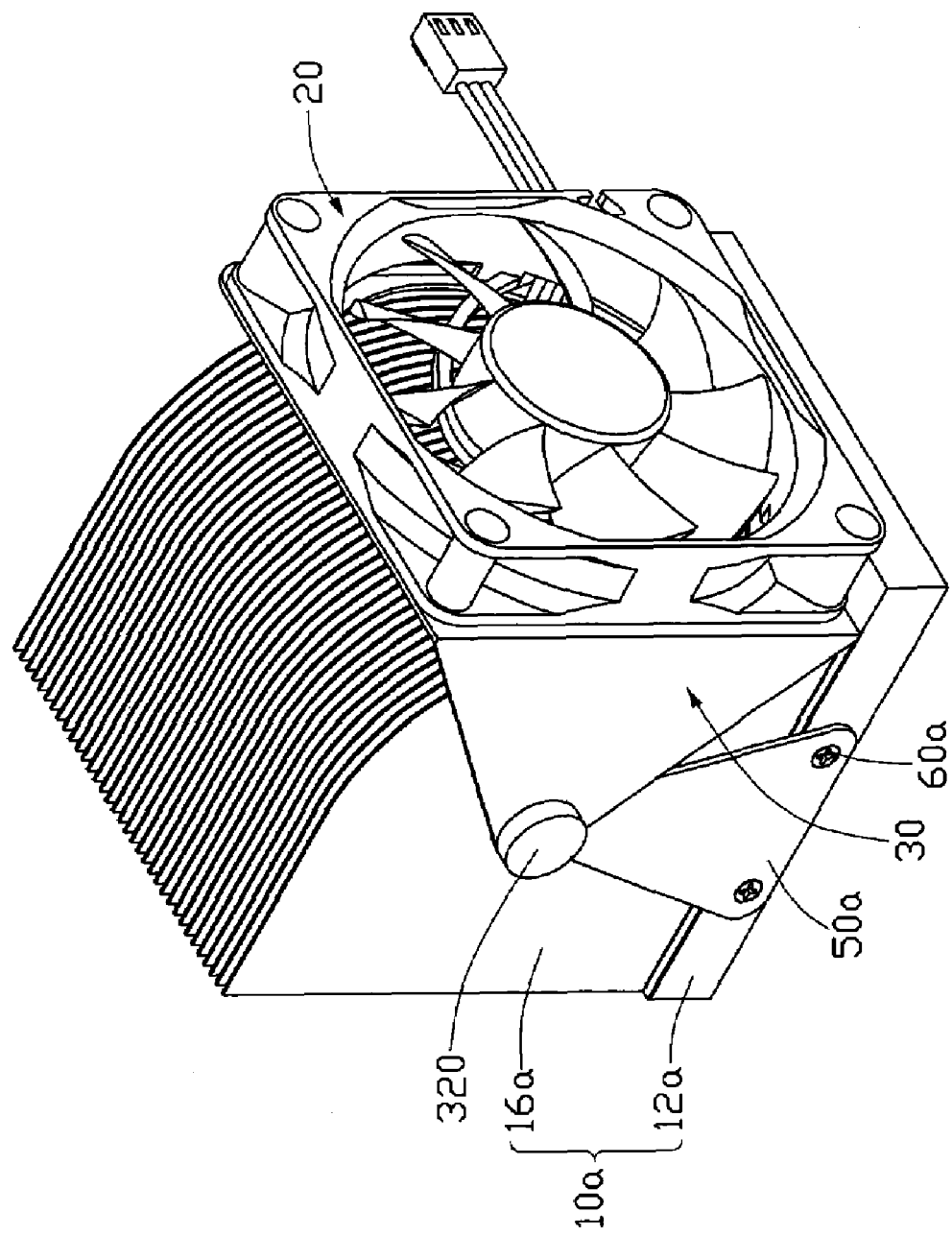
FIG. 5 is an assembled view of a heat dissipation device in accordance with a second embodiment of the present invention.
Figure 6:
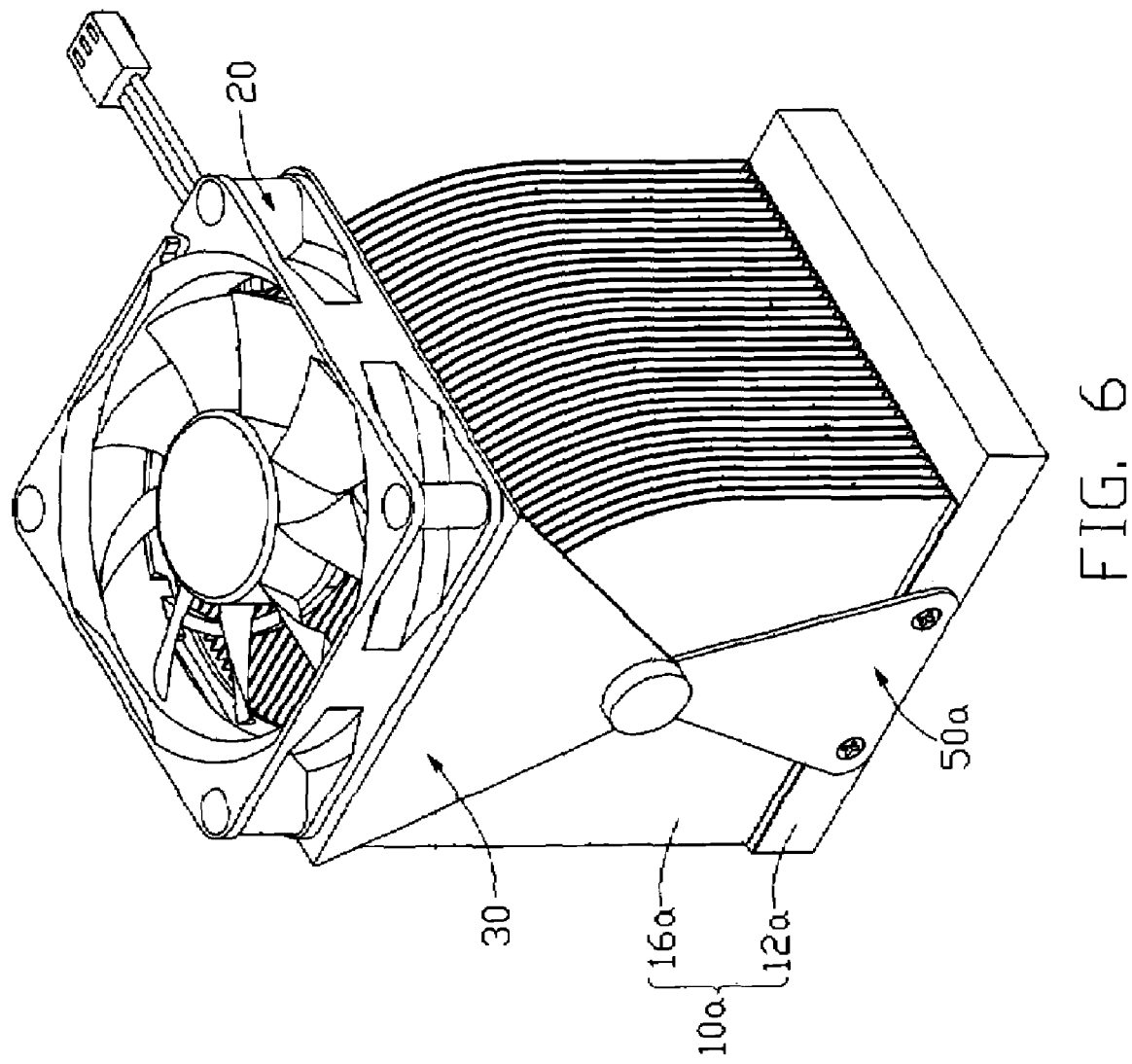
FIG. 6 is a view similar to FIG. 5, wherein a fan moves to another position different from that of FIG. 5.
Figure 7:
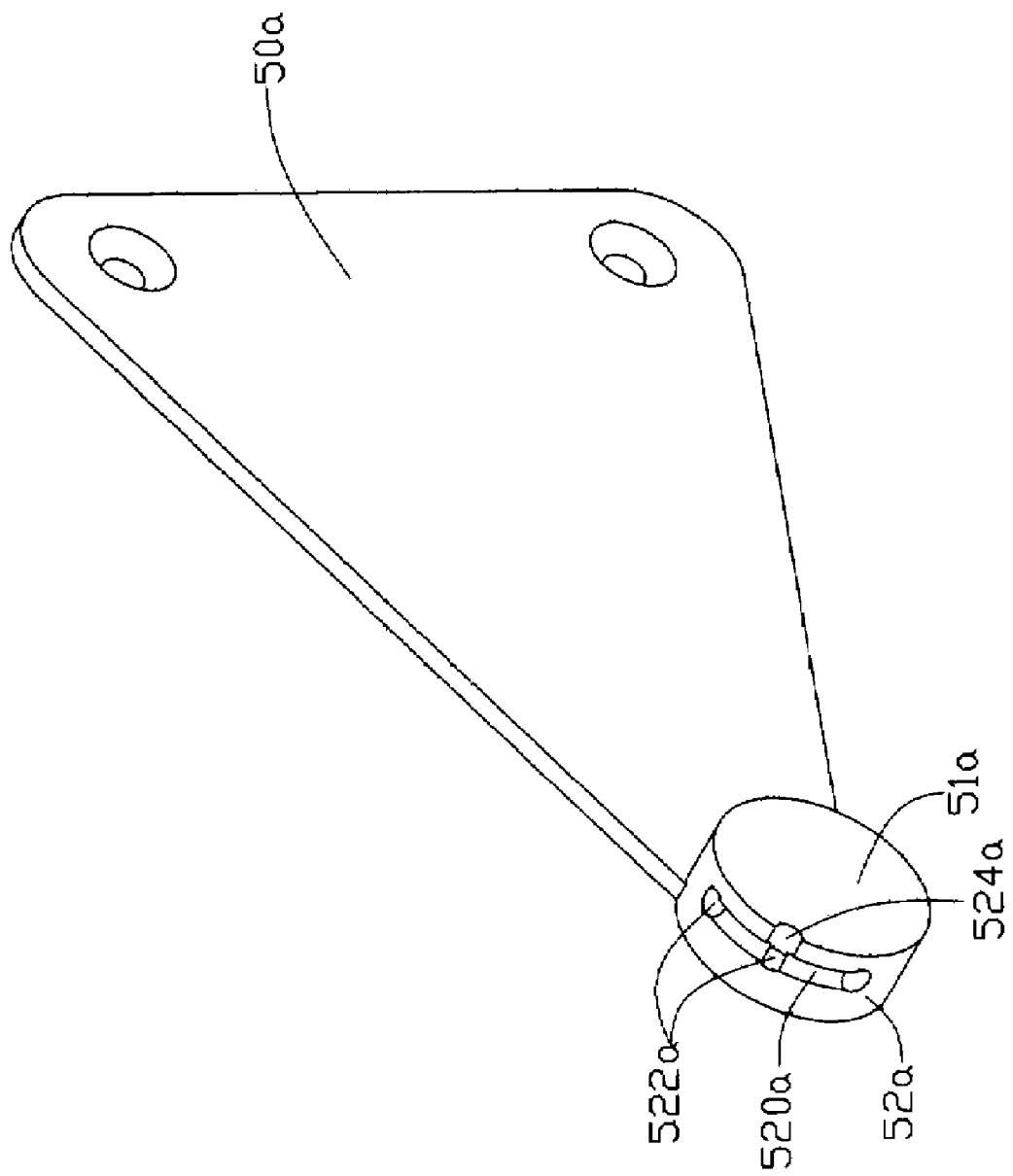
FIG. 7 is an enlarged view of a connecting element of the heat dissipation device of FIG. 5.

FIGS. 5-6 show a heat dissipation device of a second embodiment of the present invention. In this embodiment, the heat dissipation device comprises a heat sink 10a, a fan holder 30, a connecting element 50a and a fan 20, wherein the fan holder 30 and the fan 20 have the same configuration as the first embodiment. The heat sink 10a comprises a base 12a and a plurality of fins 16a perpendicularly extending from the base 12a. The base 12a and the fins 16a have configurations similar to the first embodiment, however, in the second embodiment the fins 16a are perpendicular to the base 12a while in the first embodiment the fins 16 are parallel to the base 12. The connecting element 50a has a triangular-plate configuration. The connecting element 50a extending parallel to the fins 16 is fixedly mounted on a lateral side of the base 12a via a pair of screws 60a. Also referring to FIG. 7, a solid pivot portion 51a is formed on the connecting element 50a and has a cylindrical configuration. The pivot portion 51a comprises an outer wall 52a having a diameter smaller than that of the wall 324 of the cap 320 such that the inner surface of the wall 324 of the cap 320 engages with the outer surface of the wall 52a of the connecting element 50a. The wall 52a of the connecting element 50a defines an elongated slot 520a and three spaced round recesses 522a all having the same configuration as the first embodiment. The protruding point 328 of the cap 320 slides in the slot 520a to facilitate the fan holder 30 to rotate with respect to the pivot portion 51a of the connecting element 50a, whereby the fan 20 mounted on the fan holder 30 rotates with respect to the heat sink 10a to change the airflow direction of the fan 20. In comparison with the first embodiment, the second embodiment has an additional round recess 522a in a middle of the slot 520a so that the protruding point 328 can engage in, in addition to the two round recesses 522a at the two opposite ends of the slot 520a, also the round recess 522a at the middle of the slot 520a. Thus, the fan 20 according to the second embodiment can be located at three orientations. Furthermore, in the first embodiment, the fan 20 is horizontally rotated in respect to the heat sink 10, while in the second embodiment, the fan 20 is vertically rotated in respect to the heat sink 10a.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device for a heat-generating electronic component, comprising:
  a heat sink defining a plurality of channels therein;
  a fan holder rotatably mounted on the heat sink, the fan holder comprising a mounting plate pivotably connected to the heat sink and a faceplate extending from the mounting plate;
  a connecting element fixedly mounted on the heat sink, the fan holder being pivotably connected to the connecting element;
  a cap being formed on the mounting plate of the fan holder, for rotatably engaging with the connecting element; and
  a fan fixedly mounted on the faceplate of the fan holder and facing toward the channels of the heat sink, the fan generating an airflow flowing through the channels of the heat sink; wherein when the fan holder rotates with respect to the heat sink, an airflow direction of the fan is changed accordingly.

2. The heat dissipation device of claim 1, wherein the faceplate defines an opening therein for providing passage of the airflow generated by the fan.

3. The heat dissipation device of claim 1, wherein the cap comprises a top portion and a cylindrical wall extending from an edge of the top portion, a protruding point being formed on an inner surface of the wall of the cap.

4. The heat dissipation device of claim 3, wherein the heat sink comprises a base and a plurality of fins mounted on the base.

5. The heat dissipation device of claim 4, wherein the fins are perpendicular to the base, and the connecting element is mounted on the base of the heat sink.

6. The heat dissipation device of claim 5, wherein the connecting element has one end fixed on a lateral side of the base of the heat sink and another end of the connecting element is configured as a solid pivot element pivotably engaged in the cap of the fan holder.

7. The heat dissipation device of claim 6, wherein the pivot element has a cylindrical configuration, and a slot is defined in the pivot element along a circumferential direction of the pivot element for allowing the protruding point to move therein.

8. The heat dissipation device of claim 7, wherein a plurality of recesses are defined in the slot, each of the recesses having a radial depth larger than that of the slot, the protruding point being engaged in one of the recesses.

9. The heat dissipation device of claim 8, wherein a guiding slot is defined in the pivot element along an axial direction of the pivot element, the guiding slot communicating with the slot for guiding the protruding point to smoothly enter the slot.

10. The heat dissipation device of claim 4, wherein the fins are parallel to the base of the heat sink, and a heat conducting member extending through the fins of the heat sink is formed on the base of the heat sink.

11. The heat dissipation device of claim 10, wherein the connecting element is fixedly mounted on a top portion of the heat conducting member.

12. The heat dissipation device of claim 11, wherein the connecting element has an annular configuration, and a slot is defined in the connecting element along a circumferential direction of the connecting element for allowing the protruding point to move therein.

13. The heat dissipation device of claim 12, wherein a plurality of recesses are defined in the slot, each of the recesses having a radial depth larger than that of the slot, the protruding point being engaged in one of the recesses.

14. A heat dissipation device comprising:
   a heat sink having a base for thermally connecting with an electronic component and a plurality of fins on the base, the heat sink further having a connecting piece secured thereon, the connecting piece being circular with a slot defined in a circular circumference thereof;
   a fan holder rotatably mounted on the heat sink, the fan holder having a protruding point which can slide along the slot of the connecting piece, the protruding point engaging in one of at least two locating recesses communicating with the slot; and
   a fan secured on the fan holder;
   wherein the fan can be fixed at least two different orientations by rotating the fan in respect to the heat sink from one place to another place.

15. The heat dissipation device of claim 14, wherein the fins are parallel to the base and the fan is horizontally rotatable in respect to the heat sink.

16. The heat dissipation device of claim 14, wherein the fins are perpendicular to the base and the fan is vertically rotatable in respect to the heat sink.

17. A heat dissipation device for a heat-generating electronic component, comprising:
   a heat sink defining a plurality of channels therein;
   a fan holder rotatably mounted on the heat sink, the fan holder comprising a mounting plate pivotably connected to the heat sink and a faceplate extending from the mounting plate;
   a connecting element fixedly mounted on the heat sink, the fan holder being pivotably connected to the connecting element; and
   a fan fixedly mounted on the faceplate of the fan holder and facing toward the channels of the heat sink, the fan generating an airflow flowing through the channels of the heat sink, and the faceplate defining an opening therein for providing passage of the airflow generated by the fan; wherein when the fan holder rotates with respect to the heat sink, an airflow direction of the fan is changed accordingly.

18. The heat dissipation device of claim 17, wherein a cap is formed on the mounting plate of the fan holder, for rotatably engaging with the connecting element, the cap comprising a top portion and a cylindrical wall extending from an edge of the top portion, a protruding point being formed on an inner surface of the wall of the cap.

19. The heat dissipation device of claim 18, wherein the heat sink comprises a base and a plurality of fins mounted on the base, the fins being perpendicular to the base, the connecting element being mounted on the base of the heat sink.

20. The heat dissipation device of claim 19, wherein the connecting element has one end fixed on a lateral side of the base of the heat sink and another end of the connecting element is configured as a solid pivot element pivotably engaged in the cap of the fan holder.

* * * * *